United States Patent
Solheim et al.

(10) Patent No.: US 10,136,084 B1
(45) Date of Patent: Nov. 20, 2018

(54) HDR SKIMMING PHOTODIODE WITH TRUE LED FLICKER MITIGATION

(71) Applicant: OmniVision Technologies, Inc., Santa Clara, CA (US)

(72) Inventors: Tharald Andersen Solheim, Oslo (NO); Johannes Solhusvik, Haslum (NO)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/726,860

(22) Filed: Oct. 6, 2017

(51) Int. Cl.
| | |
|---|---|
| H04N 5/359 | (2011.01) |
| H04N 5/3745 | (2011.01) |
| H04N 5/355 | (2011.01) |
| H04N 5/353 | (2011.01) |
| H01L 27/146 | (2006.01) |
| H04N 5/235 | (2006.01) |

(52) U.S. Cl.
CPC ..... *H04N 5/3591* (2013.01); *H01L 27/14609* (2013.01); *H01L 27/14641* (2013.01); *H01L 27/14643* (2013.01); *H01L 27/14654* (2013.01); *H04N 5/2355* (2013.01); *H04N 5/3535* (2013.01); *H04N 5/35554* (2013.01); *H04N 5/37452* (2013.01); *H04N 5/37457* (2013.01)

(58) Field of Classification Search
CPC ............... H04N 5/2355; H04N 5/3535; H04N 5/35554; H04N 5/35536; H04N 5/3591; H04N 5/37452; H04N 5/37456; H01L 27/14654; H01L 27/14641
See application file for complete search history.

(56) References Cited

U.S. PATENT DOCUMENTS

| | | | | |
|---|---|---|---|---|
| 6,504,141 | B1* | 1/2003 | Kozlowski | .......... H01L 27/1465 250/208.1 |
| 2015/0145007 | A1* | 5/2015 | Chieh | .................. H01L 27/1461 257/292 |
| 2015/0350574 | A1* | 12/2015 | Okado | .................... H04N 5/378 348/308 |

(Continued)

*Primary Examiner* — Daniel M Pasiewicz

(57) ABSTRACT

Apparatuses and methods for a skimming photodiode with high dynamic range (HDR) and reduced Light Emitting Diode (LED) flicker in imaging system are disclosed herein. A voltage generator provides a transfer gate voltage to a transfer transistor. The transfer gate voltage is a voltage selected one of a transfer-on, a transfer-off, and a skimming voltage. The transfer transistor transfers charges generated on a Complementary Metal-Oxide-Semiconductor (CMOS) photodiode (PD) to a floating diffusion (FD). The voltage on transfer gate controls the amount of the charges that can be transferred from the PD to the FD. A reset transistor pre-charges the PD and FD to an AVDD. A first enable transistor controls the amount of charges transferred from the FD to a first capacitor. A second enable transistor controls the amount of charges transferred from the FD to a second capacitor. The first and second enable transistors receive their individual periodical control pulses once activated. Charges collected on the first and second capacitors are transferred to the FD. A source follower transistor amplifies voltage appeared on the FD. A row select transistor sends the amplified voltage to the bitline for signal readout.

21 Claims, 4 Drawing Sheets

(56) References Cited

U.S. PATENT DOCUMENTS

2016/0112662 A1* 4/2016 Guillon ................ H04N 5/3698
                                                      348/294
2016/0360127 A1* 12/2016 Dierickx ........... H01L 27/14609
2018/0115730 A1* 4/2018 Velichko ........... H01L 27/14641

* cited by examiner

HDR SKIMMING PHOTODIODE WITH TRUE LED FLICKER MITIGATION

TECHNICAL FIELD

This disclosure relates generally to high dynamic range (HDR) image sensors, and in particular but not exclusively, relates to skimming process applied to photodiode in HDR image sensor that has capability to mitigate flickers due to light-emitting diode (LED) illuminations.

BACKGROUND INFORMATION

Image sensors have become ubiquitous. They are widely used in digital still cameras, cellular phones, security cameras, as well as medical, automobile, and other applications. High dynamic range (HDR) image sensors have been required by many of those applications. Human eyes normally possess a dynamic range of up to about 100 dB. For automobile applications, an image sensor of more than 100 dB dynamic range to deal with different driving conditions, such as driving through a dark tunnel into bright sunlight, is often required.

HDR image sensors do not always perform HDR functions properly. Common drawbacks include image degradation due to fixed pattern noise, large random noise, reduced resolution associated with charge blooming, motion artifacts, fixed sensitivity, and lower fill factor when multiple photodiodes are used, where fill factor is a ratio of a pixel's light sensitivity area to its total area.

When HDR image sensors are used to receive lights from LEDs, artifacts are common places due to the duty cycle of LED lights. LED has a tendency to emit lights out in pulses instead of in continuous and steady fashion. That has made the capture of those LED light pulses difficult due to mismatch between the emitting pulses of the LED and the receiving pulses of image sensors. For example, LED traffic lights may flicker several hundred times per second. LEDs used in head lights and brake lights in many modern cars behave very similarly.

A typical LED is normally driven by a pulse-width modulation (PWM) controller. The use of PWM has benefits such as adjustable light intensity through duty cycles, less heat buildup to extent life span, and power savings. When the LED pulse is on, it provides high lighting condition. When the LED pulse is off, it provides low lighting condition. The modulation frequency runs from a few tens to a few thousands of hertz. That's normally not noticeable to human eyes. However, rapid LED pulse makes it difficult for the conventional method, even guarded with HDR capability, to perform proper LED imaging. Since the capture rate of the sensor can easily mismatch the emission rate of the LED, for most of the time, LED light cannot be caught evenly from frame to frame. Even the double exposure technique cannot mitigate the LED flicker effectively. One of the worst case of this is automobile lights made of LEDs that need to be detected when blended with the strong reflection of the sun light.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
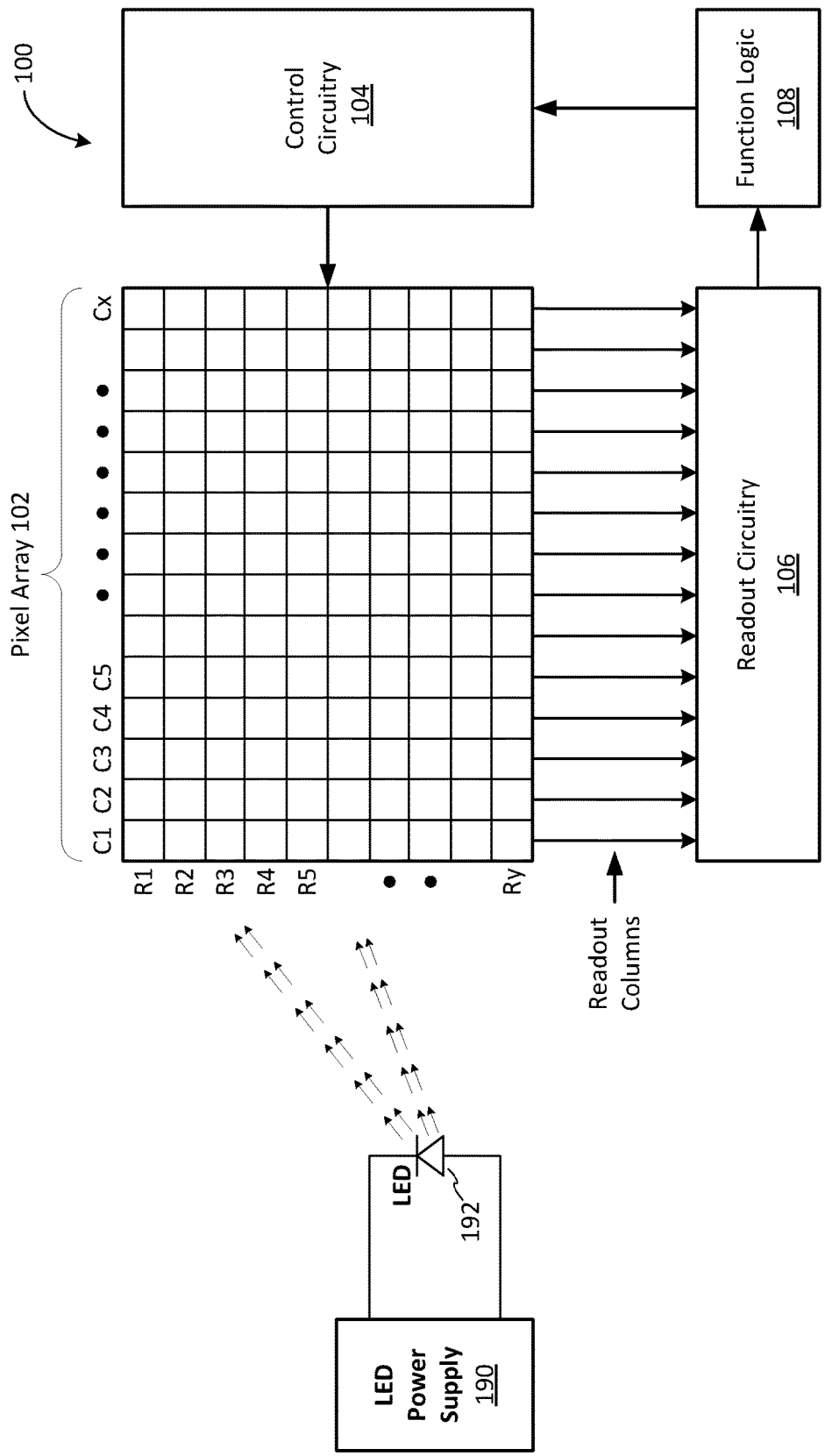
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus and method for a skimming photodiode in an HDR imaging sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1 illustrates one example of an imaging system 100 in accordance with an embodiment of the present disclosure. Imaging system 100 includes pixel array 102, control circuitry 104, readout circuitry 106, and function logic 108. In one example, pixel array 102 is a two-dimensional (2D) array of photodiodes, or image sensor pixels (e.g., pixels P1, P2 . . . , Pn, not shown in figure). As illustrated, photodiodes are arranged into rows (e.g., rows R1 to Ry) and columns (e.g., column C1 to Cx) to acquire image data of a person, place, object, etc., with or without LED illuminations, which can then be used to render a 2D image of the person, place, object, etc. However, photodiodes do not have to be arranged into rows and columns and may take other configurations.

In one example, LED 192 emits light pulses to illuminate objects to be imaged, or light pulses of LED 192 are to be sensed by image sensors directly. After each image sensor photodiode/pixel in pixel array 102 has acquired its image charge through photo-generation of the image charge, corresponding image data is read out by readout circuitry 106 and then transferred to function logic 108. Readout circuitry 106 may be coupled to read out image data from the plurality of photodiodes in pixel array 102. In various examples, readout circuitry 106 may include amplification circuitry, analog-to-digital conversion (ADC) circuitry, and so on. In one example, readout circuitry 106 may read out a row of image data at a time along readout column lines (illustrated as "Readout Columns") or may read out the image data using a variety of other techniques (not illustrated), such as a serial readout or a full parallel readout of all pixels simultaneously. Function logic 108 may simply store the image data or even manipulate the image data by applying post image effects (e.g., crop, rotate, remove red eye, adjust brightness, adjust contrast, and so on). In some embodiments, function logic 108 may require certain imaging conditions to be met and may therefore instruct the control circuitry 104 to manipulate certain parameters in pixel array 102 to achieve better qualities or special effects.

Figure 2:
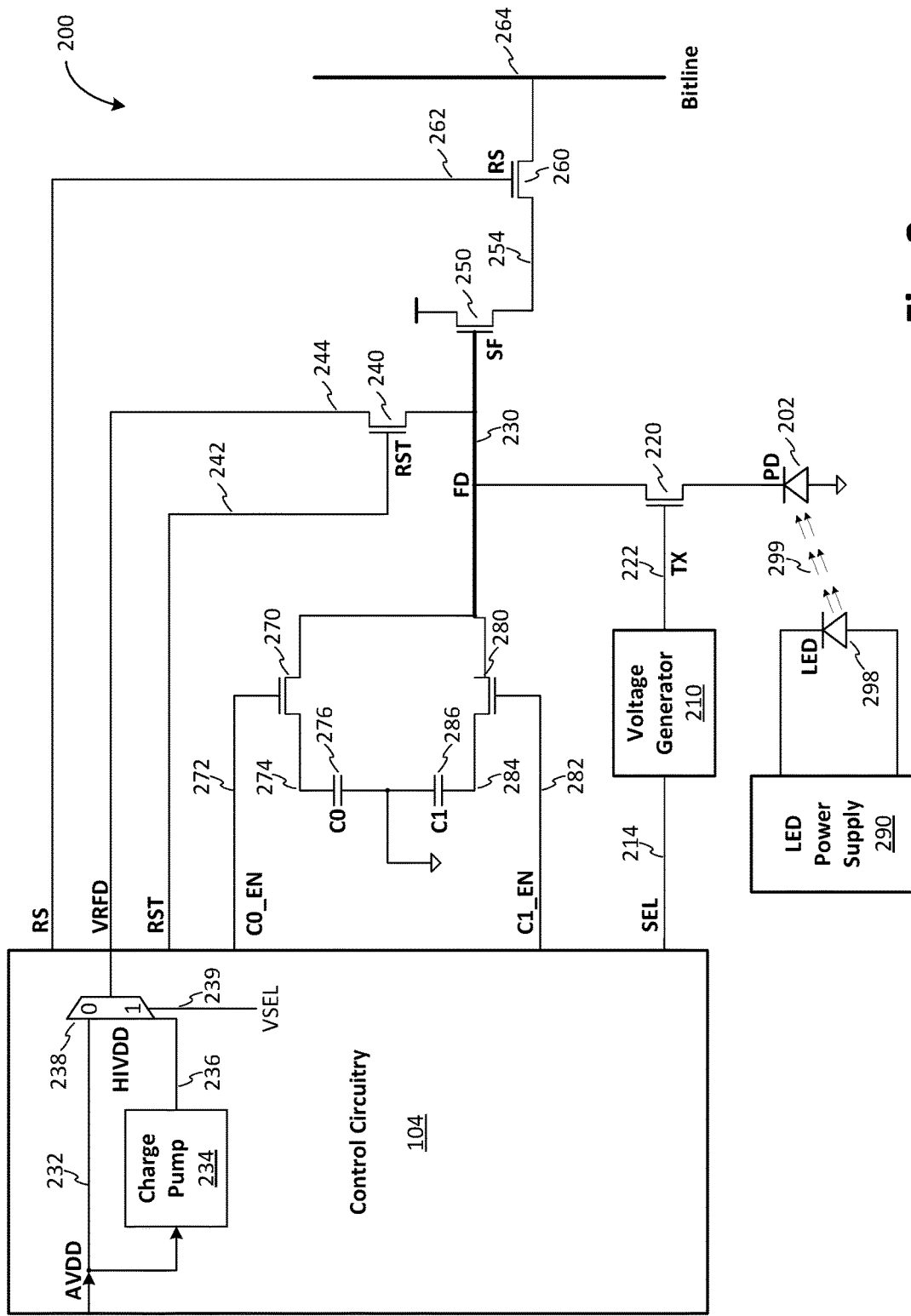
FIG. 2 is an example schematic of a block diagram of a skimming photodiode in an HDR imaging sensor that is capable of mitigating LED flickers in accordance with an embodiment of the present disclosure.

FIG. 2 is one example of block diagram of a skimming photodiode in a HDR imaging sensor that is capable of mitigating LED flickers in accordance with an embodiment of the present disclosure. The illustrated embodiment of image sensor system 200 may comprise the illuminating LED 292, a detecting photodiode 202, and a typical 4 transistor (4T) pixel, where the 4T portion may include a transfer transistor 220, a reset transistor 240, a source follower transistor 250, and a row select transistor 260. The node where the drain of the transfer transistor 220, the source of the reset transistor 240, and the gate of the source follower transistor 250 meet is a floating diffusion (FD) 230. Also attached to the FD 230 are a first enable transistor 270 and a second enable transistor 280 that couple a first capacitor C0 276 and a second capacitor C1 286 to FD 230, respectively. The first capacitor C0 276 is connected to FD 230 when the gate of the first enable transistor 270 is asserted by a first capacitor enable signal C0_EN 272 which is controlled by the control circuitry 104. Similarly, the second capacitor C1 286 is connected to FD 230 when the gate of the second enable transistor 280 is asserted by a second capacitor enable signal C1_EN 282 which is controlled by the control circuitry 104. Also under control of the control circuitry 104 are reset signal RST 242 and row select signal RS 262 that enable conductions of the reset transistor 240 and the row select transistor 260, respectively.

The transfer transistor 220 is enabled by a voltage generator 210 through a transfer signal TX 222. The transfer transistor 220 can be switched on when a high connect voltage $V_{HI}$ is asserted to the TX 222, under which the photo-generated signal charges accumulated at PD 202 can be transferred to the FD 230 completely. The transfer transistor 220 can be switched off when a low enough disconnect voltage $V_{LO}$ is asserted to the TX 222, under which no charges from PD 202 is transferred to FD 230. When the potential of TX 222 is set properly to a voltage lying between the connecting voltage $V_{HI}$ and the disconnecting voltage $V_{LO}$, the transfer transistor is partially connected. Excessive charges due to strong illuminations may start leaking through the transfer transistor, from the PD 202 to the FD 230. Such a potential that makes a partial connection from PD 202 to FD 230 is called a skimming voltage ($V_{SK}$). Photodiode 202 with its transfer transistor 220 under control by such a skimming voltage is called a skimming photodiode. Skimming photodiode may be a normal photodiode or a pinned photodiode (PPD). In the case of the PPD, physical structure wise, a shallow p+ pinning layer is added on top of the n-layer of a normal photodiode in fabrication process. A PPD makes the concept of skimming photodiode easier to implement.

Under low light exposure, charge below the skimming threshold potential remains entirely within the PD 202. This is a high sensitivity mode. When charges are saturated within PD 202, excessive charges overflow to the FD 230 under skimming mode. This is preferred over blooming to the neighbor photodiodes that are next to the PD 202. Skimmed charges may be stored in storage nodes or capacitors. A few of those nodes/capacitors may be staggered time-wise so that each node/capacitor gets a portion of flicking light from LED 298. If time staggering is fast enough, at least a portion of the flicking lights is captured on each node/capacitor. LED flicker may be completely mitigated if exposure staggering is arranged frequent enough. Excessive skimmed charges may even be dumped by the reset transistor under very strong light. Exposure time for a node/capacitor may be set through the duty cycle of node/capacitors connected to FD 230.

For example, exposure time for the first capacitor C0 is activated when C0_EN 272 is maintained during the ON state of the duty cycle. C0_EN 272 is controlled by control circuitry 104 with a single pulse or a series of periodical pulses. The ON state duty cycle of C0_EN does not coincide with the ON state duty cycle of the C1_EN 282. That way, the exposure times for C0 and C1 are staggered and have no overlaps.

A PPD has the merits of less image lag, lower transfer loss, lower thermal (kTC) and reset noise, a much lower dark current and higher full well capacity when $V_{LO}$ is negatively biased, in comparing with a normally zero-potential-biased photodiode. A normal correlated double sampling (CDS) performs well with PPD as does on a normal photodiode.

An appropriate skimming voltage ($V_{SK}$) may be determined by analyzing the results from photo-generated charges collected at the readout circuitry 106. As a consequence, function logic 108 may receive the signal data from the readout circuitry 106, and may instruct the control circuitry 104 what to do next with the output of voltage generator 210. In other words, voltage generator 210 receives a selection command SEL 214 from the control circuitry 104, and takes action on what skimming voltage threshold $V_{SK}$ to set, or $V_{HI}/V_{LO}$ to set. It puts one of the three voltages among $V_{LO}$, $V_{SK}$, and $V_{HI}$ to TX 222 of transfer transistor 220 for the best effect.

Figure 3:
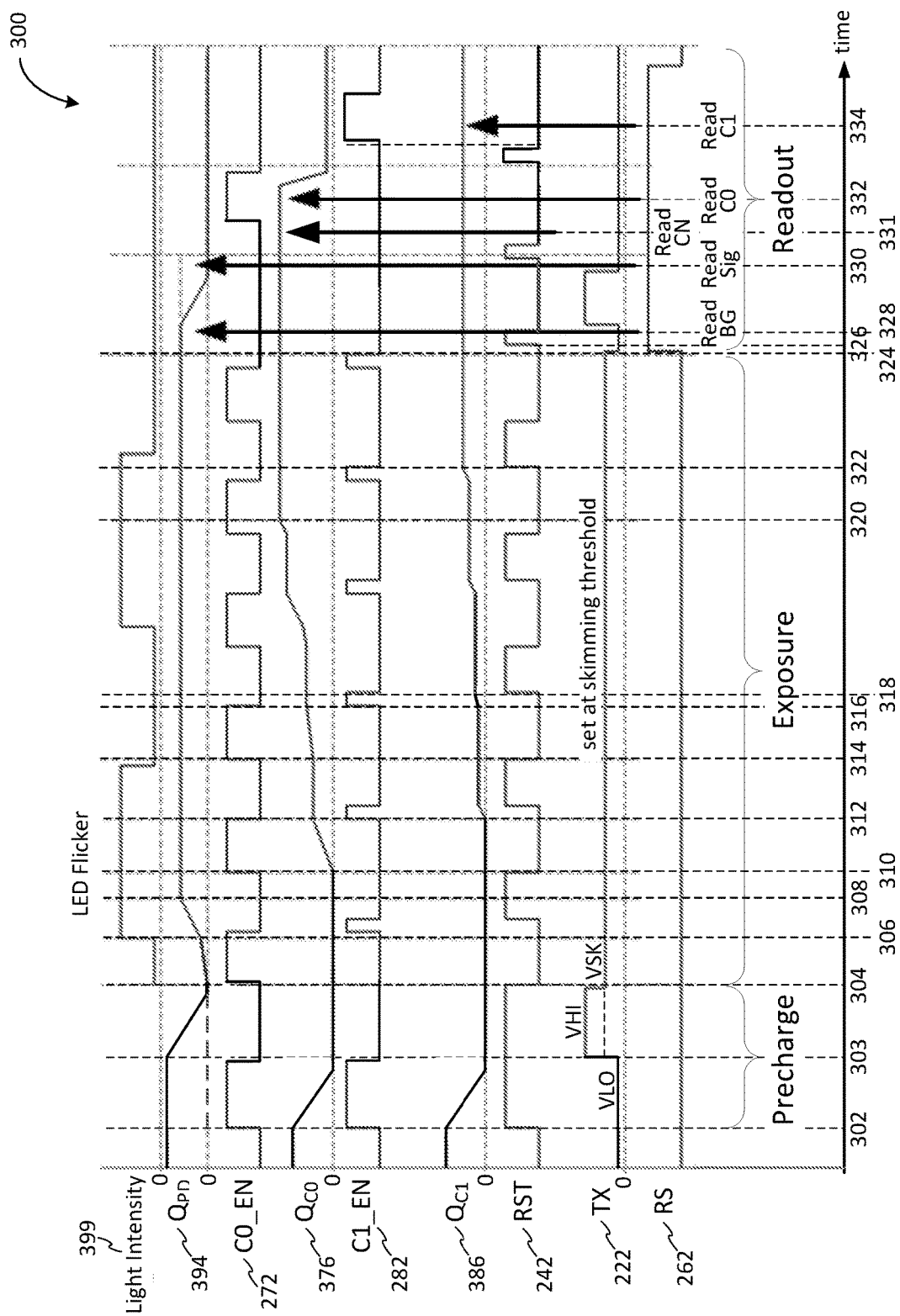
FIG. 3 is an example waveform in association with the operation of the skimming photodiode in an HDR imaging sensor in dealing with LED flickers in accordance with an embodiment of the present disclosure.

FIG. 3 is an illustrative operation of a skimmed photodiode 300 in accordance with an embodiment of the present disclosure. To better understand FIG. 3 and the sequence it represents, a flowchart of timing is provided in FIG. 4 to explain all major events shown in FIG. 3 in conjunction with FIG. 2.

Figure 4:
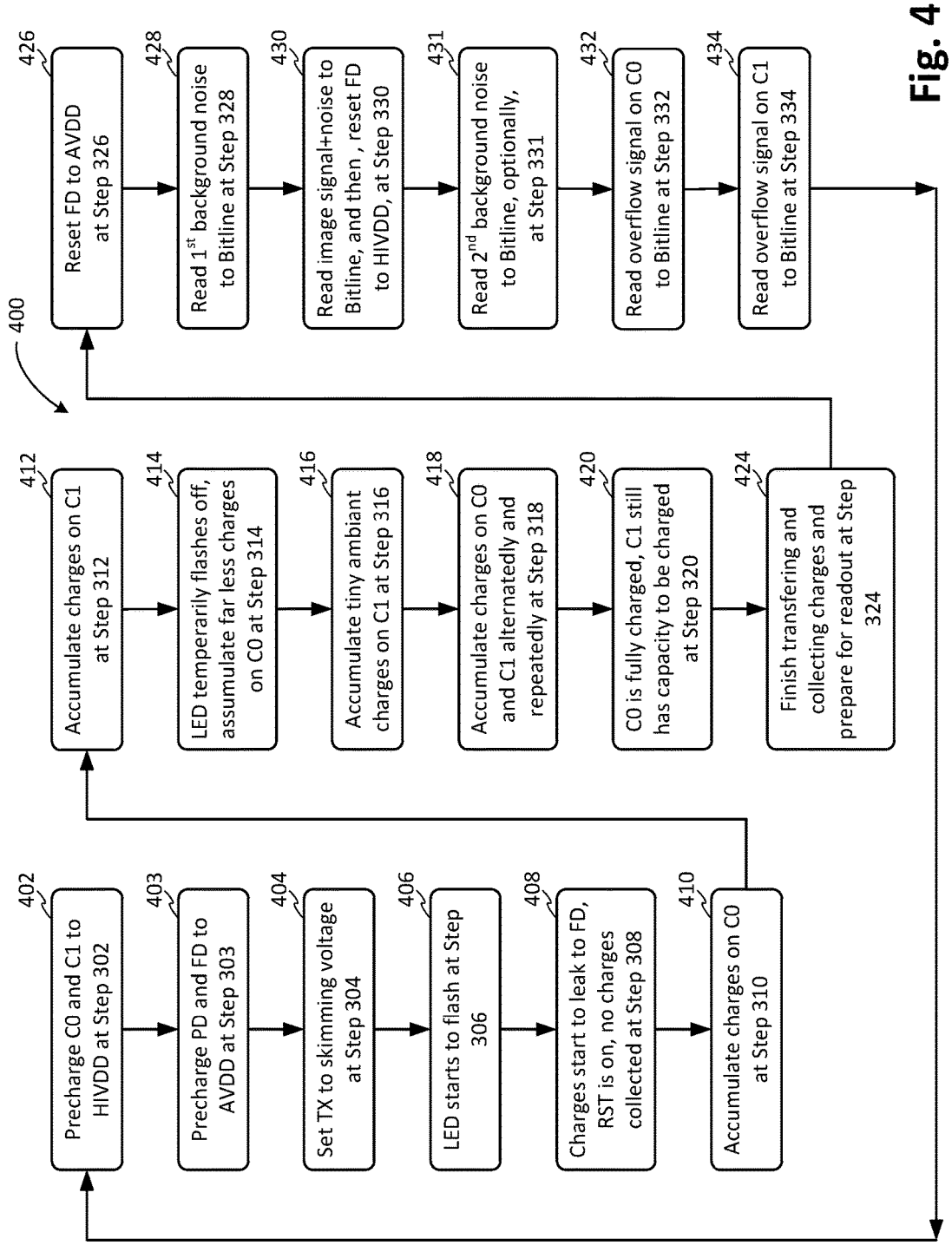
FIG. 4 is an illustrative flow chart in associate with the events of FIG. 3 in accordance with an embodiment of the present disclosure.

FIG. 4 is an illustrative flow chart 400 in accordance with an embodiment of the present disclosure. The flow chart 400 may illustrate a complete cycle on how LED flickers are captured in a typical single capture cycle using the disclosed skimmed photodiode and circuitry.

The flow chart 400 begins at process block 402. Process block 402 starts from time point 302 and ends at time point 303. During block 402, a first capacitor C0 276 and a second capacitor C1 286 as previously described in FIG. 2 are both pre-charged to a voltage HIVDD 236 through VRFD 244, where HIVDD 236 is higher in potential than the power supply voltage AVDD 232. HIVDD 236 may be achieved by using a charge pump 234 based on AVDD 232. Inside Control Circuit 104, when the voltage select signal VSEL 239 is set to 1, multiplexer 238 puts HIVDD 236 to its output VRFD 244. This programmable output VRFD 244 supplies a value of HIVDD to both C0 276 through a C0 enable transistor 270 and C1 286 through a C1 enable transistor 280 when signals RST 242, C0_EN 272 and C1_EN 282 turn a reset transistor 240, the C0 enable transistor 270 and the C1 enable transistor 280 on, respectively and simultaneously.

A higher initial potential HIVDD on C0/C1 at nodes 274/284 makes it easier to attract the skimmed charges to C0/C1 from FD 230 that is reset at relative lower potential AVDD. A higher initial potential HIVDD on C0/C1 at nodes 274/284 helps charge accumulation on C0/C1 throughout the "Exposure" period as shown in FIG. 3. As more and more charges are accumulated on C0 or C1 each time they are connected to FD 230, potentials on 274 or 284 are lowered each time. When the potentials on C0 or C1 lowers to the same potential of the FD 230 that bears the skimmed charges at the moment, none of those skimmed charges are accumulated on C0 or C1. Because at this point of equilibrium, charge flows stop. C0 or C1 appear to be saturated. Saturation of $Q_{C0}$ is demonstrated at time point 320 for C0 for instance.

The process block 402 may be followed by process block 403. Process block 403 starts from time point 303 and ends at time point 304. During block 403, a photo diode (PD) 202 and a floating diffusion (FD) 230 are both pre-charged to power supply voltage AVDD. When VSEL 239 is set to 0, multiplexer 238 puts AVDD 232 to its output. As a programmable output of the Control Circuit 104, VRFD 244 supplies a value of AVDD during this block to FD 230 through a reset transistor 240 and then to PD 202 through transfer transistor 220 between time point 302 and time point 304.

In the same process block 403, transfer transistor 220 is also fully switched on by TX signal 222 to pre-charge PD 202 to AVDD. TX signal 222 is asserted by Voltage Generator 210 which is under control of SEL signal 214 from Control Circuitry 104. During the process blocks 402 and 403 which are marked as "Precharge" in FIG. 3 between time points 302 and 304, both C0 276 and C1 286 are initiated to a ready-to-operate voltage HIVDD, both PD 202 and FD 230 are initiated to a ready-to-operate voltage AVDD. In other words, the "Precharge" resets $Q_{PD}$ 394, $Q_{C0}$ 376, $Q_{C1}$ 386, and electron charges in FD 230 to zeroes some times before time point 304. $Q_{PD}$ 394 is electron charges converted from photons by continuous exposure of photodiode 202 to incident light as indicated by Light Intensity 399. $Q_{C0}$ 376 and $Q_{C1}$ 386 are electron charges stored in capacitors C0 276 and C1 286, respectively.

In FIG. 3, incident light is presented as Light Intensity 399. Light Intensity 399 has two levels of value. LED being on provides the higher level. When LED is off, the object/ambient provides the lower level, but never zero. Whenever RST 242 is low, control signal C0_EN 272 allows electron charges from FD 230 being accumulated as $Q_{C0}$ 376 in C0 276. Likewise, whenever RST 242 is low, control signal C1_EN 282 allows electron charges from FD 230 being accumulated as $Q_{C1}$ 386 in C1 286.

The process block 403 may be followed by process block 404. Process block 404 starts from time point 304 and ends at time point 306. During block 404, reset transistor 240 is switched off by RST 242. Transfer transistor 220 is turned mostly off (but not completely off) by setting TX signal 222 to $V_{SK}$. $V_{SK}$ is a value lying between $V_{LO}$ and $V_{HI}$. It is called skimming threshold as shown in FIG. 3. Applying $V_{SK}$ to TX 222 allows excessive electrons generated by PD 202 to leak through transfer transistor 220 and reach FD 230. This prevents PD 202 from blooming electrons to its neighbor photodiodes after being saturated under condition of strong light. And during block 404, although LED is off, electron charges start to accumulate in $Q_{PD}$ 394 due to weak ambient light which is not zero as shown by Light Intensity 399. $Q_{PD}$ 394 has not reached the saturation point yet, therefore no charges overflow to FD 230. $Q_{C0}$ 376 ends with no charges being accumulated although C0_EN 272 is enabled. $Q_{C1}$ 386 ends with no charges being accumulated either since no charges can reach C1 from FD 230 when C1_EN 282 is disabled.

The process block 404 may be followed by process block 406. Process block 406 covers between time point 306 and time point 308. During block 406, to begin with, reset transistor 240 is off and C0_EN 272 is on. Then, C0_EN 272 is off and C1_EN 282 is on, followed by C1_EN 282 switching off and RST 242 switching on. Transfer transistor 220 remains the mostly-off status with $V_{SK}$ continuously applied to its gate TX 222. LED flashed on from time point 306 on as shown in Light Intensity 399. Electron charges start to accumulate in $Q_{PD}$ 394 more rapidly as indicated by the steeper slope of in FIG. 3 between time points 306 and 308, in comparing to that of the previous block 404. But still, $Q_{PD}$ 394 has not reached the saturation point yet for any charges to overflow to FD 230. $Q_{C0}$ 376 ends with no charges being accumulated since C0_EN 272 is disabled. $Q_{C1}$ 386 ends with no charges to accumulate either although C1_EN 282 is enabled during a fraction of the current block of 406.

The process block 406 may be followed by process block 408. Process block 408 covers between time points 308 and 310. During block 408, reset transistor 240 remains on. LED remains on as can be told by a high level of Light Intensity 399. Transfer transistor 220 remains at skimming state. Electron charges accumulated in $Q_{PD}$ 394 reaches the saturation point and remains full. The excessive charges in PD 202 start to leak to FD 230 through transfer transistor 220. Charges generated on PD 202 and charges leaked away from PD 202 reach equilibrium during this process block as shown by the plateau for $Q_{PD}$ 394 in FIG. 3 The leaked charges from PD 202 do not have a chance being accumulated in FD 230 since reset transistor 240 is switched on by RST 242. All leaked charges in FD 230 are removed immediately by AVDD through programmable VRFD 244 throughout this entire block of 408. Both $Q_{C0}$ 376 and $Q_{C1}$ 386 remain their steady status, and remain zero during this block when reset transistor 240 is switched on.

The process block 408 may be followed by process block 410, Process block 410 covers between time points 310 and 312. During block 410, reset transistor 240 is off. Transfer transistor 220 remains at skimming state. LED remains on continuously as shown in Light Intensity 399. PD 202 remains its equilibrium status during this block as shown by the plateau for $Q_{PD}$ 394 in FIG. 3. Large amount of excessive charges in PD 202 continuously leak to FD 230 through transfer transistor 220. $Q_{C0}$ 376 accumulates electron charges rapidly, as shown with a steep slope, since C0_EN 272 is now enabled. $Q_{C1}$ 386 ends with no charges to accumulate since C1_EN 282 is disabled entirely during the current block of 410.

The process block 410 may be followed by process block 412. Process block 412 covers between time points 312 and 314. During block 412, reset transistor 240 is off initially when C1_EN 282 is on. Transfer transistor 220 remains at skimming state. LED remains on continuously as shown in Light Intensity 399. PD 202 remains its equilibrium status during this entire block as shown by the plateau for $Q_{PD}$ 394 in FIG. 3. Large amount of excessive charges in PD 202 continuously leak to FD 230 through transfer transistor 220. $Q_{C0}$ 376 stays the same as the previous amount of its accumulated electron charges, since C0_EN 272 is now disabled. $Q_{C1}$ 386 accumulates electron charges rapidly, as shown with a short but steep slope when C1_EN 282 is now enabled for a short period of time, as shown by a narrow pulse immediately following the time point 312. Notice all C1_EN 282 pulses are narrower than C0_EN 272 pulses, so accumulation of $Q_{C1}$ 386 is less than that of the $Q_{C0}$ 376, assuming C0 and C1 have similar capacitance values. In other embodiments, C0 and C1 can have much different capacitance values. When RST 242 is switched on after C1_EN 282 is switched off, both $Q_{C0}$ 376 and $Q_{C1}$ 386 maintains their steady values, because both C0_EN 272 and C1_EN 282 are now turned off. For each RST/C0_EN/C1_EN cycle, RST 242 always leads the cycle by clearing all charges on FD 230. This is to make sure that all the skimmed charges collected at FD 230 are converted from the most recent LED illumination on PD 202, and subsequent charges transferred from FD 230 to C0 or C1 are related to light conditions in concurrent cycle only.

The process block 412 may be followed by process block 414. Process block 414 covers between time points 314 and 316. During block 414, reset transistor 240 is turned off. Transfer transistor 220 remains its skimming state. LED goes off as indicated by the low level of Light Intensity 399. PD 202 remains its equilibrium status during this block as shown by the plateau for $Q_{PD}$ 394 in FIG. 3. LED is off here. Smaller amount of excessive charges in PD 202, caused by ambient light, continuously leak to FD 230 through transfer transistor 220. C0_EN 272 is switched on, and $Q_{C0}$ 376 accumulates far less electron charges as indicated by the shallower slope of FIG. 3 between time point 314 and 316. $Q_{C1}$ 386 has no change collected since C1_EN 282 is disabled entirely during the current block of 414.

The process block 414 may be followed by process block 416. Process block 416 covers between time points 316 and 318. During block 416, reset transistor 240 remains off. Transfer transistor 220 remains at skimming state. Since LED is still off, electron charges accumulate very slowly in $Q_{PD}$ 394. $Q_{C0}$ 376 is not collecting any charges since C0_EN 272 is now disabled. C1_EN 282 is switched on, and $Q_{C1}$ 386 ends with a very tiny ramp up due to a very shallow slope (in comparing to that of the block 312) during a very short time duration of C1_EN pulse.

The process block 416 may be followed by process block 418. Process block 418 covers between time points 318 and 320. During block 418, the RST/C0_EN/C1_EN cycle repeats itself for as many times as needed during the "Exposure" period. Transfer transistor 220 remains at skimming state. QPD 394 stays saturated. RST 242 resets FD 230 to make sure that all the skimmed charges collected at FD 230 are freshly converted within the same cycle. Subsequently, C0_EN 272 and C1_EN 282 take one alternation to be switched on and off after RST 242 is switched off for each RST/C0_EN/C1_EN cycle. $Q_{C0}$ 376 and $Q_{C1}$ 386 keep increasing in turns, corresponding to C0_EN 272 and C1_EN 282 as illustrated in FIG. 3.

The process block 418 may be followed by process block 420. Process block 420 covers between time points 320 and 324. During block 420, Transfer transistor 220 remains at skimming state. RST/C0_EN/C1_EN cycle continues as before with C0_EN being on at time point 320 to begin with. The cycle repeats itself and finishes as indicated by the end of the last pulse for C1_EN at time point 324. Since LED remains on as before at time point 320, electron charges accumulate fast again in $Q_{PD}$ 394. So are the skimmed charges that appear at FD 230. $Q_{C0}$ 376 finally saturates at time point 320. At its saturation point, no more electron charges can be added to C0 anymore regardless of whether C0_EN is continuously on or not onward after time point 320. At the moment C0_EN 272 toggles off, C1_EN 282 toggles on, and $Q_{C1}$ 386 gains some additional electron charges at time point 322. C1 still has capacity to accumulate more charges before its own saturation point is reached. LED goes off not long after time point 322, ambient light becomes the only source of light. By the time the next short pulse comes for C1_EN, C1 gains no noticeable charges because few charges are collected under such a weak light when LED is off.

It is appreciated that C0 reaches its saturation earlier than C1 because C0 accumulates charges faster than C1. As illustrated in FIG. 3, periodical signal C0_EN 272 has much wider pulse than that of the C1_EN 282 for each cycle. That means there is more time to move more charges from FD 230 to C0 than C1. Varying the pulse widths of C0_EN and C1_EN is the essence of this disclosure in order to achieve HDR. By having only two capacitors C0 and C1, and adjustable ratio between C0_EN and C1_EN, high dynamic range and high sensitivity can both be achieved with adaption to different lighting conditions and flickering conditions. Sensitivity ratio between the two captures of C0 and C1 defines the dynamic range as well as sensitivity of image pixels.

In this disclosure, more charges reach C0 as seen by $Q_{C0}$ during each RST/C0_EN/C1_EN cycle. As illustrated as "Exposure" between time points 304 and 324, for each RST/C0_EN/C1_EN cycle, RST 242 always leads the cycle by clearing all charges on FD 230. RST/C0_EN/C1_EN are staggered in a way so that, after RST 242 toggles off, C0_EN 272 toggles on. After C0_EN 272 toggles off, C1_EN 282 toggles on. After C1_EN 282 toggles off, RST 242 toggles on again. Following each RST 242, C0 and C1 are charged only with newly updated charges from the most recent light exposures. Since C0_EN starts at the point when RST stops; C1_EN starts at the point when C0_EN stops; RST starts at the point when C1_EN stops, the start and stop times of the captures (where C0_EN and C1_EN are enabled alternately) are almost the same, the position of fast moving objects in the scene is captured almost the same way on C0 and C1.

In a physical chip, the first capacitor C1 276 and the second capacitor C2 286 are integrated next to each pixel of plurality of pixels in a pixel array 102.

The process block 420 may be followed by process block 424. Process block 424 covers between time points 324 and 326. From time point 324 onward, the process enters the "Readout" period. It is indicated by row select RS 262 being enabled from this time point onward. During block 424, LED is off. Reset transistor 240 is off. Transfer transistor 220 is turned completely off from its skimming state at time point 324 to mark the end of charge transfer from PD 202 to FD 230 due to any lights. C0_EN 272 and C1_EN 282 are also switched off at the time point 324 to mark the end of the charge collections on C0 and C1 as measured by $Q_{C0}$ and $Q_{C1}$. Duration of process block 424 should be kept the shortest between time points 324 and 326. Such condition is required to minimize continuous charge increase in PD 202 due to the ambient light although LED is turned completely off during this period.

During the entire period of "Exposure", not only RST/C0_EN/C1_EN are staggered, the first staggering frequency of C0_EN, the second staggering frequency of C1_EN, and the reset staggering frequency of RST are kept the same. This common staggering frequency can be chosen to be 3 to 10 times that of the LED operation frequency to mitigate the LED flickers.

The process block 424 may be followed by process block 426. Process block 426 covers between time points 326 and 328. During block 426, nothing has changed since block 424 except that RST 242 is enabled to reset FD 230 to AVDD through programmable VRFD 244 to prepare a fresh readout. This process gets the corresponding image pixel ready to be read out through the correlated double sampling (CDS) mechanism.

The process block 426 may be followed by process block 428. Process block 428 covers between time points 328 and 330. At time point 328, the reset to FD 230 just finishes. Background charges on FD 230 are read out onto the Bitline 264. This process is the first step required by a CDS. For this step, a first background noise signal is collected. Image signal is still preserved on PD 202 and is isolated by transfer transistor 220 by setting TX 222 to $V_{LO}$. The row select transistor 260 has switched on since time point 324 by RS 262. RS 262 is controlled by Control Circuitry 104 as illustrated in FIG. 2. The first FD background noise signal 254 amplified by source follower 250 flows to Bitline 264 at time point 328. After this first background noise signal readout, signal charges on PD 202 are allowed to flow to FD 230 by introducing a wide pulse of $V_{HI}$ to TX 222.

The process block 428 may be followed by process block 430. Process block 430 covers between time points 330 and 331. At time point 330, transferred image charges from PD 202 to FD 230 are read out onto the Bitline 264, immediately after the charge transfer from PD 202 to FD 230. This is the second CDS step. Between the time points 328 and 330 in the previous process block 428, transfer transistor 220 is switched completely on by setting TX 222 to $V_{HI}$. This allows all charges accumulated on PD 202 to be transferred to FD 230. The duration of TX being $V_{HI}$ depends on how long it transfers all charges from PD 202 to FD 230 completely. For a PPD, such transfer is fast with less image lag, low transfer loss, and lower noise, as discussed in previous section.

Total charges appeared on FD 230 is the summation of the background noise and the image signal combined. For a CDS, the pure image signal is reduced by subtracting the first noise obtained in the first step (block 428) from the noise added signal obtained in this current second step (block 430). Such subtraction can be done in the Readout Circuitry 106 in either analog way or digital way after the ADC.

Between time points 330 and 331, the reset transistor 240 is switched on and off by a RST signal 242 to set FD 230 to HIVDD through programmable VRFD 244 to clear all charges transferred from PD 202 to FD 230 caused by current block 430. This helps to return FD 230 to its status of background noise so FD 230 is ready to accept charges from other signal storage devices like C0 and C1.

The process block 430 may be followed by process block 431. Process block 431 covers between time points 331 and 332. At time point 331, the reset of FD 230 to HIVDD through programmable VRFD 244 just finishes. Background charges on FD 230 are read out onto the Bitline 264. This process is optional. It's a third step to form a CDS. For this step, a second background noise signal is collected. The second FD background noise signal 254 amplified by source follower 250 flows to Bitline 264 at time point 331. After this second background noise signal readout, signal charges on C0 276 or C1 286 are allowed to flow to FD 230 by introducing a wide pulse to either C0_EN 272 or C1_EN 282, respectively.

The process block 431 may be followed by process block 432. Process block 432 covers between time points 332 and 334. At time point 332, $Q_{C0}$ 376—the charges accumulated in C0 are read out onto the Bitline 264. This is the fourth CDS step. C0_EN 272 is enabled at time point 332. Transfer transistor 220 remains off from time point 324 onward as indicated by TX 222 being set to $V_{LO}$. This allows nothing else but all charges accumulated on the C0 to be attracted to FD 230 since FD 230 is charged to HIVDD in block 431. Total charges appear on the FD 230 is the portion of the overflown charges (which includes background noise) accumulated on C0. For a CDS, the pure image signal of the first overflown portion from C0 is reduced by subtracting the first noise obtained in the first step (block 428) or optionally the second noise obtained in the third step (block 431) from the noise added signal obtained in the fourth step (block 432) from C0. Such subtraction can be done in Readout Circuitry 106 in either analog way or digital way after the ADC.

The process block 432 may be followed by process block 434. Process block 434 covers between time point 334 and a time for re-start of the iteration. At time point 334, $Q_{C1}$ 386—the charges accumulated in C1 are read out onto the Bitline 264. This is the fifth CDS step. Between time points 332 and 334, after C0_EN 272 pulse goes off, the capacitor reset transistor 290 is switched on and off by the RST signal 242 to set FD 230 to HIVDD through VRFD 244 to clear all charges appear on FD 230 which takes place in the previous process block 432. C1_EN 282 is enabled at time point 334. Transfer transistor 220 remains off as indicated by TX 222 being set to $V_{LO}$. This allows nothing else but all charges accumulated on C1 to be attracted to FD 230 since FD 230 is charged to HIVDD right before time point 334. Total charges appeared on FD 230 are the charges accumulated on C1 (which includes background noise). For a CDS, the pure image signal of C1 is reduced by subtracting the noise obtained in the first step (block 428) or optionally the second noise obtained in the third step (block 431) from the noise added signal obtained in the fifth step (block 434) from C1. Such subtraction can be done in Readout Circuitry 106 in either analog way or digital way after the ADC.

The process block 434 may be followed by process block 402, which completes an iteration cycle as previously disclosed. In each cycle, the background voltage acquired at time point 328, the signal voltage acquired at time point 330, the first capacitor voltage acquired at time point 332, and the second capacitor voltage acquired at time point 332, are read from bitline 264 and stored in the readout circuitry 106. These four signals in combination offer a complete and loss-free charge map that achieves the high dynamical range (HDR) with good sensitivity to mitigate the LED flickers.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A skimming photodiode image sensor with high dynamic range (HDR) and reduced Light Emitting Diode (LED) flicker, comprising:
   a transfer transistor coupled to transfer generated charges from a Complementary Metal-Oxide-Semiconductor (CMOS) photodiode (PD) to a floating diffusion (FD);
   a voltage generator coupled to receive a select signal from a control circuitry and provide a transfer gate voltage to the transfer transistor, wherein the select signal selects the transfer gate voltage to be one of a transfer-on voltage VHI, a transfer-off voltage VLO, and a skimming voltage VSK;
   a reset transistor coupled to introduce a reset voltage through a voltage supply VRFD to the FD under the control of a reset gate voltage, wherein the reset gate voltage is controlled by the control circuitry, wherein the VRFD is a programmable voltage controlled by VSEL of the control circuitry (104), wherein VRFD selects between two values of AVDD and HIVDD, wherein HIVDD is a higher potential than AVDD;
   a source follower transistor (SF) coupled to receive voltage of the FD at its gate and provide an amplified voltage at its source;
   a row select transistor (RS) coupled to receive the amplified voltage at source of the SF and provide this voltage to a bitline under the control of a RS gate voltage, wherein the RS gate voltage is controlled by the control circuitry, and bitline is connected to a readout circuitry;
   a first enable transistor coupled to enable a charge transfer from the FD to a first capacitor, wherein a first charge enable signal of the first enable transistor is controlled by the control circuitry; and
   a second enable transistor coupled to enable a charge transfer from the FD to a second capacitor, wherein a second charge enable signal of the second enable transistor is controlled by the control circuitry.

2. The skimming photodiode image sensor of claim 1, wherein the transfer gate voltage on the transfer transistor controls the amount of the charges that can be transferred from the PD to the FD, and wherein the skimming voltage VSK is set between the transfer-on voltage VHI and the transfer-off voltage VLO of the TG.

3. The skimming photodiode image sensor of claim 1, wherein the CMOS photodiode (PD) is a pinned photodiode (PPD) that has an added p+ layer on top of the n-layer of a normal photodiode.

4. The skimming photodiode image sensor of claim 1, wherein the first charge enable signal turns on the first enable transistor during a first time period; and the second charge enable signal turns on the second enable transistor during a second time period, wherein the first time period and the second time period are different.

5. The skimming photodiode image sensor of claim 1, wherein a first pulse width of the first charge enable signal and a second pulse width of the second charge enable signal are controlled by the Control Circuitry to adapt to the lighting conditions.

6. The skimming photodiode image sensor of claim 1, wherein the first charge enable signal turns on the first enable transistor during a first time period; the second charge enable signal turns on the second enable transistor during a second time period; and the reset gate voltage turns on the reset transistor during a reset time period, wherein the reset time period and the first time period are different, wherein the first time period and the second time period are different, wherein the second time period and the reset time period are different.

7. A method of skimming a photodiode image sensor to mitigate Light Emitting Diode (LED) flicker, comprising, in the following order:
   (a) receiving an illuminated input from an LED by a photodiode, wherein the LED is powered by an LED power supply and lights generated by the LED in an alternate strong and dim way periodically under an LED frequency;
   (b) (step 402) pre-charging a first capacitor and a second capacitor to a known potential of HIVDD through a voltage supply VRFD by setting each of a reset gate (RST), a first charge enable signal, and a second charge enable signal to a high voltage, wherein the VRFD is a programmable voltage controlled by the control circuitry, wherein VRFD selects between two values of AVDD and HIVDD, wherein HIVDD is a higher potential than AVDD;
   (c) (step 403) precharging a photodiode (PD) and a floating diffusion (FD) to a known potential of AVDD through VRFD by setting a reset gate (RST) and a transfer gate (TX) to a high voltage;
   (d) exposing the PD to the illumination sourced by the LED;
   (e) (step 404) providing the TX with a skimming voltage VSK generated by the voltage generator, wherein the skimming voltage VSK keeps the transfer transistor moderately on and accumulated excessive charges at the PD leak to the FD;
   (f) (step 410) switching the first charge enable signal on and off periodically under a first charge staggering frequency during which the PD is exposed to the LED;
   (g) (step 412) switching the second charge enable on and off periodically under a second charge staggering frequency during which the PD is exposed to the LED;
   (h) (step 424) switching off the first charge enable, the second charge enable, and the TX after 10 to 100 charge cycles;
   (i) (step 426) resetting the FD by switching on and off the TX immediately following the switch off of the first charge enable, the second charge enable, and the TX;
   (j) (step 428) reading a first background charges on the FD from dark current, wherein a first background voltage is provided on a bitline when a row select transistor is turned on by a row select signal (RS), wherein the RS is controlled by the control circuitry;
   (k) transferring the charges from the PD to the FD by switching the transfer transistor on and then off;
   (l) (step 430) reading a photo-generated signal charges transferred from the PD to the FD, wherein a signal voltage is provided on the bitline when the row select transistor is turned on by the row select (RS), wherein the RS is controlled by the control circuitry;
   (m) resetting the FD to a voltage HIVDD through VRFD by switching on and off the RST, wherein the reset gate voltage is controlled by the control circuitry;
   (n) (step 431) reading a second background charges on the FD from dark current, wherein a second background voltage is provided on a bitline when a row select transistor is turned on by a row select signal (RS), wherein the RS is controlled by the control circuitry;
   (p) (step 432) reading a first capacitor charges from the first capacitor to the FD by switching the first enable transistor on and off, wherein a first capacitor voltage is provided on the bitline when the row select transistor is turned on by the RS, wherein the RS is controlled by the control circuitry;

(q) resetting the FD to HIVDD through VRFD by switching on and off the reset gate voltage; and (r) (step 434) reading a second capacitor charges from the second capacitor to the FD by switching the second enable transistor on and off, wherein a second capacitor voltage is provided on the bitline when the row select transistor is turned on by the RS, wherein the RS is controlled by the control circuitry.

8. The method of claim 7, wherein the first charge staggering frequency in (f) is the same as the second charge staggering frequency in (g).

9. The method of claim 7, wherein the first charge staggering frequency in (f) is 3 to 10 times that of the LED frequency, and the second charge staggering frequency in (g) is 3 to 10 times that of the LED frequency, and the first charge staggering frequency and the second charge staggering frequency are controlled by the control circuitry.

10. The method of claim 7, wherein the first charge enable has a first duty cycle to activate collection of charges to the first capacitor.

11. The method of claim 7, wherein the second charge enable has a second duty cycle to activate collection of charges to the second capacitor.

12. The method of claim 7, wherein the first enable transistor turns on the first enable transistor during a first time period; and the second charge enable signal turns on the second enable transistor during a second time period, wherein the first time period and the second time period are different.

13. The method of claim 7, wherein the first charge enable signal turns on the first enable transistor during a first time period; the second charge enable signal turns on the second enable transistor during a second time period; and the reset gate voltage turns on the reset transistor during a reset time period, wherein the reset time period and the first time period are different, wherein the first time period and the second time period are different, wherein the second time period and the reset time period are different.

14. The method of claim 7, wherein a first background voltage and a signal voltage read from bitline to the readout circuitry are stored, and wherein the first background voltage is subtracted from the signal voltage to complete the correlated double sampling (CDS) process.

15. The method of claim 7, wherein a first capacitor voltage and a second capacitor voltage read from the bitline to the readout circuitry are stored, and wherein the first background voltage is subtracted from the first capacitor voltage, and the first background voltage is subtracted from the second capacitor voltage to complete the correlated double sampling (CDS) process.

16. The method of claim 7, wherein a first capacitor voltage and a second capacitor voltage read from the bitline to the readout circuitry are stored, and wherein the second background voltage is subtracted from the first capacitor voltage, and the second background voltage is subtracted from the second capacitor voltage to complete the correlated double sampling (CDS) process.

17. A high dynamic range (HDR) imaging system with skimming photodiodes and Light Emitting Diode (LED) flicker reduction, comprising:

a pixel array of pixel cells, wherein each one of the pixel cells includes:

a transfer transistor coupled to transfer generated charges from a Complementary Metal-Oxide-Semiconductor (CMOS) photodiode (PD) to a floating diffusion (FD), wherein a transfer gate voltage on a transfer transistor controls the amount of the charges that can be transferred from the PD to the FD;

a voltage generator coupled to receive a select signal from a control circuitry and provide a transfer gate voltage to a transfer transistor, wherein the select signal selects the transfer gate voltage to be one of a transfer-on voltage VHI, a transfer-off voltage VLO, and a skimming voltage VSK;

a reset transistor coupled to introduce a reset voltage through a voltage supply VRFD to FD under the control of a reset gate voltage, wherein the reset gate voltage is controlled by the control circuitry, wherein VRFD is a programmable voltage controlled by VSEL of the control circuitry, wherein VRFD selects between two values of AVDD and HIVDD, wherein HIVDD is a higher potential than AVDD;

a source follower transistor (SF) coupled to receive voltage of the FD at its gate and provide an amplified voltage at its source;

a row select transistor (RS) coupled to receive the amplified voltage at source of the SF and provide this voltage to a bitline under the control of a RS gate voltage;

a first enable transistor coupled to enable a charge transfer from the FD to a first capacitor;

a second enable transistor coupled to enable a charge transfer from the FD to a second capacitor;

a control circuitry coupled to the pixel array to control operation of the pixel array; and a readout circuitry coupled to the pixel array to readout image data from the plurality of pixels.

18. The HDR imaging system of claim 16 further comprising an LED light source coupled to an LED power supply, wherein the LED alternatively emits visible lights periodically under an LED frequency that is detected by each one of the plurality of photodiodes.

19. The HDR imaging system of claim 16, wherein the skimming voltage VSK is set between the transfer-on voltage VHI and the transfer-off voltage VLO of the transfer gate TX.

20. The skimming photodiode of claim 16, wherein the PD is a pinned photodiode (PPD) that has an added p+ layer on top of the n-layer of a normal photodiode.

21. The skimming photodiode of claim 16, wherein the first capacitor and the second capacitor are integrated next to each pixel of plurality of pixels in a pixel array.

\* \* \* \* \*